United States Patent [19]
Graven et al.

[11] Patent Number: 5,894,400
[45] Date of Patent: Apr. 13, 1999

[54] METHOD AND APPARATUS FOR CLAMPING A SUBSTRATE

[75] Inventors: Andrew J. Graven; Melvin Schmidt, both of San Jose, Calif.; Kenneth A. McCuen, Maryland, Md.; Yunju Ra, Irvine, Calif.

[73] Assignee: WJ Semiconductor Equipment Group, Inc., Scotts Valley, Calif.

[21] Appl. No.: 08/865,330

[22] Filed: May 29, 1997

[51] Int. Cl.$^6$ ..................................... H02N 13/00
[52] U.S. Cl. ..................... 361/234; 279/128; 361/235
[58] Field of Search ........................... 361/230, 233, 361/234, 235; 269/8; 279/128

[56] References Cited

U.S. PATENT DOCUMENTS

| | | | |
|---|---|---|---|
| 5,103,367 | 4/1992 | Horwitz et al. | 361/234 |
| 5,117,121 | 5/1992 | Watanabe et al. | 307/130 |
| 5,223,457 | 6/1993 | Mintz et al. | 437/225 |
| 5,315,473 | 5/1994 | Collins et al. | 361/234 |
| 5,452,177 | 9/1995 | Frutiger | 361/234 |
| 5,459,623 | 10/1995 | Birang et al. | 361/234 |
| 5,463,525 | 10/1995 | Barnes et al. | 361/234 |
| 5,491,603 | 2/1996 | Birang et al. | 361/234 |
| 5,708,250 | 1/1998 | Benjamin et al. | 361/234 |
| 5,737,175 | 4/1998 | Grosshart et al. | 361/234 |
| 5,737,177 | 4/1998 | Mett et al. | 361/234 |

*Primary Examiner*—Fritz Fleming
*Attorney, Agent, or Firm*—Flehr Hohbach Test Albritton & Herbert LLP

[57] ABSTRACT

A method and apparatus for securely clamping a substrate to an electrostatic chuck during processing of a substrate. The method generally includes the steps of forming an initial electrostatic clamping force between the electrostatic chuck and the substrate, modifying the initial electrostatic clamping force when an rf voltage is applied to the electrostatic chuck during processing, and restoring the initial electrostatic clamping force with an offset voltage applied to the electrostatic chuck. The present invention also includes an electrostatic chuck having at least one electrode and a dielectric on the surface of the electrode for supporting a substrate. A voltage source is coupled to the electrode for electrostatically clamping the substrate to the surface of the electrostatic chuck with an initial electrostatic force. An rf source is coupled to the electrode for applying rf voltage to the electrostatic chuck and causing a change in the initial electrostatic force. A control system is coupled to the rf source and voltage source for producing an offset voltage in response to the change in the initial electrostatic force thereby restoring the initial electrostatic force.

11 Claims, 5 Drawing Sheets

5,894,400

METHOD AND APPARATUS FOR CLAMPING A SUBSTRATE

FIELD OF THE INVENTION

The present invention relates in general to electrostatic chucks, and more specifically to a method and apparatus for securely clamping a substrate to an electrostatic chuck during processing of the substrate.

BACKGROUND OF THE INVETION

Plasma processing techniques are used to deposit films on the surface of substrates or to modify films on the substrates. These techniques are widely used, for example, in the semiconductor or flat panel industries to fabricate integrated circuits. During semiconductor processing, a substrate such as a silicon wafer is placed in a processing reactor and chemical vapor deposition (CVD) techniques may be used to deposit a layer of material on the surface of the wafer. A plasma environment may be utilized to provide plasma enhanced CVD (PECVD). Additionally, an etching process may be employed where a previously deposited film is modified in some desired manner, usually to form circuit components or interconnect lines.

During such processing the wafer is often supported in the reactor by a chuck. Various chuck designs are well known in the art. One type of chuck support often used with PECVD techniques is an electrostatic chuck. An electrostatic chuck generally includes at least one electrode and a thin dielectric coating across the surface of the electrode. The wafer is electrostatically clamped to the chuck by applying a dc voltage to the electrode. This causes a voltage to develop across the dielectric and image charges are induced on the wafer. The opposite charges attract the wafer to the chuck, clamping the entire wafer to the chuck surface with a force referred to as an "electrostatic force" or a "clamping force." This clamping force is proportional to the square of the voltage and inversely proportional to the separation between the electrodes of the chuck and the wafer. If the voltage or the nature of the dielectric varies across the chuck, the clamping force will vary as well. One example of an electrostatic chuck is fully described in co-pending U.S. application Ser. No. 08/500,480 (Attorney file no. A-62195/AJT/JEM) which is incorporated herein by reference.

During processing, temperature gradients develop across the wafer and may cause non-uniform processing, such as variations in the deposition rate which adversely affects the film quality, or may even damage the underlying integrated circuit. Consequently, it is desirable to control the temperature of the surface of the wafer. Temperature control may be accomplished by placing the backside (the surface where no processing occurs) of the wafer in thermal contact with a temperature control medium. Typically, a gas such as helium is used, and is introduced between the backside of the wafer and the surface of the chuck support. The gas conducts heat between the two surfaces and can be utilized to either heat or cool the wafer as process conditions warrant. Heat transfer improves with gas pressure.

The presence of the gas medium creates certain problems. The force generated by the pressure of the gas between the wafer and the chuck surface is generally greater than the weight of the wafer, and thus the gas tends to push the wafer off the chuck. Consequently, the electrostatic force securing the wafer must be great enough to overcome this opposite force.

During processing, it is often desired to sputter etch the surface of the wafer with ions. Sputter etching may take place during a deposition step to produce good gap fill in submicron dimension gaps, and to enhance the deposition of void-free, dense, conformal films. To sputter etch the surface of the wafer, an rf bias is applied to the wafer which causes the acceleration of ions from the plasma sheath present in the reactor toward the surface of the wafer.

Due to the nature of the plasma, any object which is not at ground and is placed in the plasma environment will acquire a net negative charge. This causes an "induced dc voltage" to be established on the surface of the wafer exposed to the plasma. The induced dc voltage is defined as the time average of the voltage on the wafer surface exposed to the plasma. Additionally, when rf power is applied across a capacitor (as in the case where rf bias is applied to the chuck and dielectric to induce sputter etching), the voltage of the surface of an object exposed to the plasma will become more negative. Consequently, with the application of rf bias, the induced dc voltage on the wafer is changed, and most importantly, the clamping force securing the wafer is also changed. This change in clamping force results in non-uniform processing of the wafer, temperature gradients across the wafer surface, and in the worse case, declamping of the wafer causing a catastrophic failure of the process and arcing within the reactor.

OBJECTS AND SUMMARY OF THE INVETION

Accordingly, it is an object of the present invention to provide a method and apparatus for securely clamping a wafer during processing.

It is a further object of the present invention to provide a method and apparatus for restoring an initial electrostatic force, which is modified after rf bias is applied to the electrostatic chuck.

Another object of the present invention is to provide a method and apparatus that utilizes a controller responsive to an rf input to provide an offset voltage to the wafer for restoring an initial electrostatic force.

These and other objects are achieved by the method herein disclosed of securing a substrate to an electrostatic chuck throughout processing, generally comprising the steps of forming an initial electrostatic clamping force between the electrostatic chuck and the substrate, modifying the initial electrostatic clamping force when rf voltage is applied to the electrostatic chuck during processing, and restoring the initial electrostatic clamping force by applying offset voltage to the electrostatic chuck.

The invention also includes an electrostatic chuck having an inner electrode and an outer electrode and a dielectric on the surface of the inner and outer electrode for supporting a substrate. The electrostatic chuck generally includes a voltage source coupled to the inner and outer electrodes for electrostatically clamping the substrate to the surface of the electrostatic chuck with an initial electrostatic force. An rf source is coupled to the inner and outer electrodes for applying rf voltage to the electrostatic chuck and causing a change in the initial electrostatic force. A control system is coupled to the rf source and voltage source for producing an offset voltage in response to the change in the initial electrostatic force thereby restoring the initial electrostatic force.

BRIEF DESCRIPTION OF THE DRAWINGS

Other objects and advantages of the invention will become apparent upon reading of the detailed description of the invention and the appended claims provided below, and upon reference to the drawings in which:

DETAILED DESCRIPTION OF THE INVENTION

Figure 1:
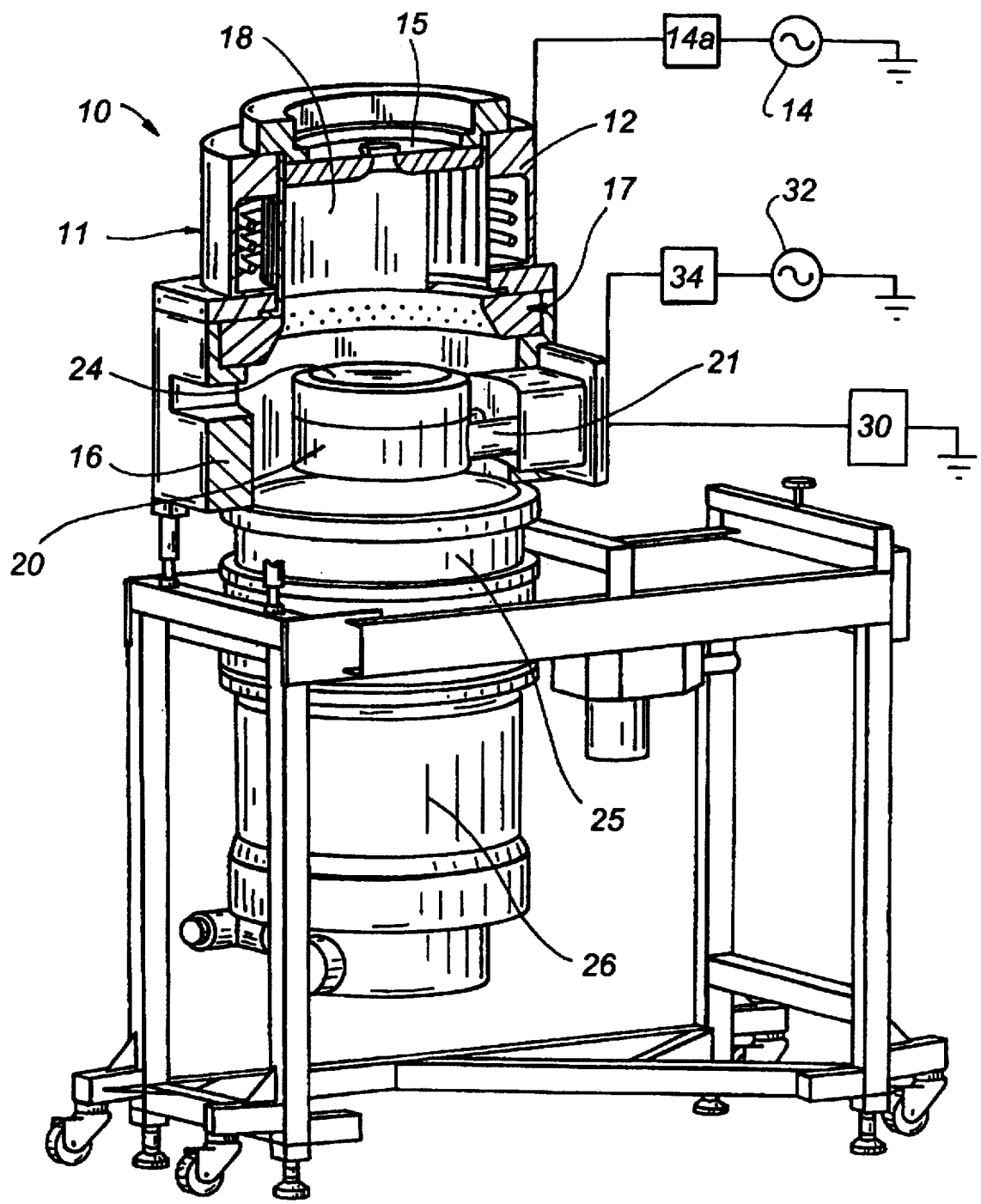
FIG. 1 is a partially broken away assembly view of a CVD reactor including an electrostatic chuck suitable for practice of the present invention.
Figure 2:
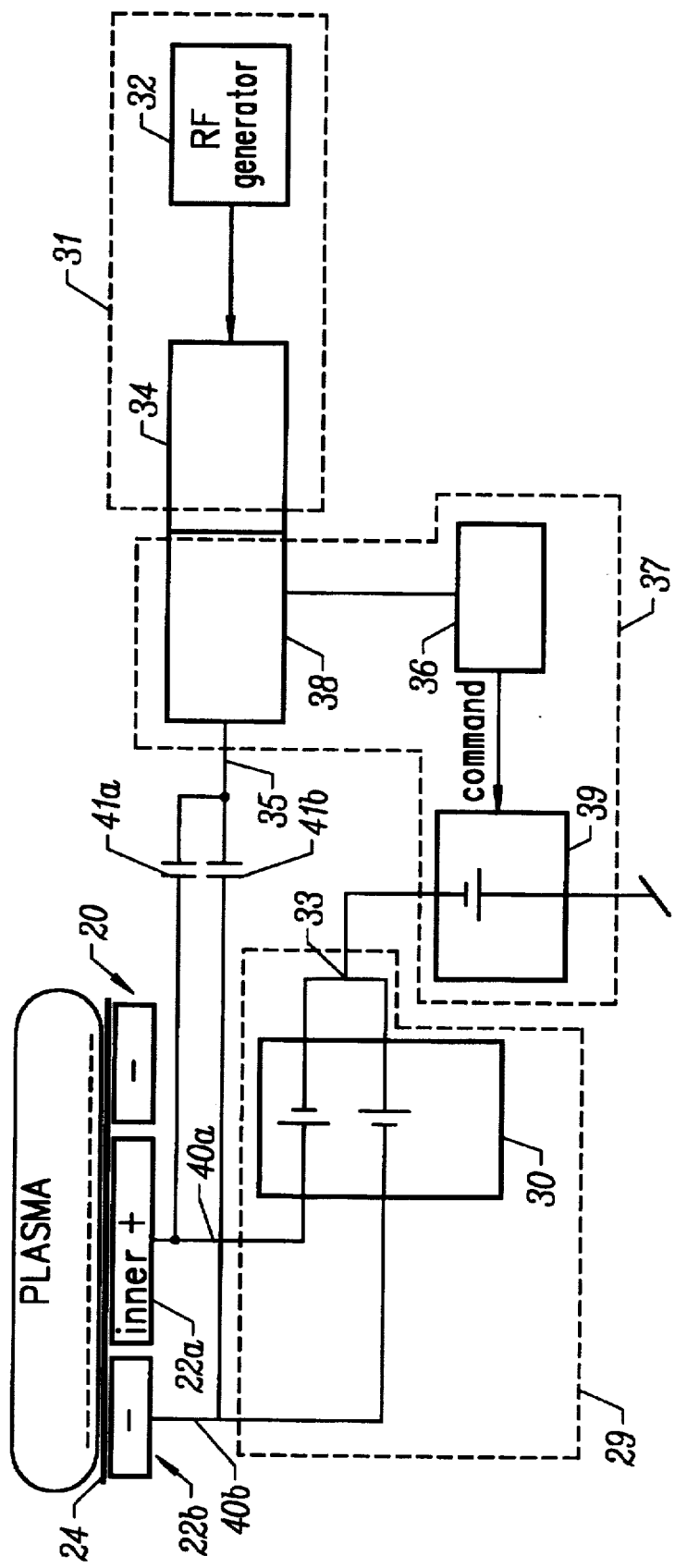
FIG. 2 is a schematic cross sectional view, partially broken away of the electrostatic chuck of the present invention.

Turning to the drawings, wherein like components are designated by like reference numbers in the figures, FIGS. 1 and 2 represent a Chemical Vapor Deposition (CVD) reactor including an electrostatic chuck suitable for practice of the present invention. FIGS. 1 and 2 illustrate a partially broken away assembly view of a reactor 10 generally including a plasma assembly 11 and a process chamber 16. In an exemplary embodiment, the plasma assembly 11 includes a plasma generating source 12, the interior of such source 12 forms a plasma chamber 18, and a first gas injection manifold 15 forms the top of the chamber 18. Energy 14 is directed into the plasma source 12 via a matching network 14a. The plasma assembly 11 is operatively attached to the process chamber 16. The process chamber 16 includes a second gas injection manifold 17 mounted to the inner peripheral surface of the process chamber 16 to form a ring. Positioned within the process chamber 16 is an electrostatic chuck 20 to support a substrate or wafer 24. The electrostatic chuck 20 is attached to the process chamber 16 by at least one arm member 21 such that the chuck is suspended within the process chamber 16. DC voltage is applied to the electrostatic chuck 20 by voltage generator 30. The electrostatic chuck 20 may be biased by applying rf energy from generator 32 via matching network 34. A vacuum system is provided for exhausting the reactor 10. In an exemplary embodiment a vacuum pump 26 is operatively coupled to the process chamber 16 by port 25, and the vacuum pump 26 is substantially axially aligned with the process chamber 16.

While a specific example describing a CVD reactor is shown herein, it will be apparent to those of ordinary skill in the art that the inventive method and electrostatic chuck may be employed in any type of processing reactor that utilizes an electrostatic chuck, including but not limited to plasma enhanced CVD, high density plasma, low pressure and sub-atmospheric reactors, and etching reactors.

The electrostatic chuck is shown in greater detail with reference to FIG. 2. The electrostatic chuck 20 generally includes an inner and an outer electrode 22a and 22b, a dc voltage system 29, an rf voltage system 31 and an offset voltage control system 37, described in further detail below. Additionally, the electrostatic chuck 20 often includes a cooling system having a plurality of gas distribution groves formed in the dielectric surface(not shown) for uniformly distributing a cooling medium, such as helium, between the wafer 24 and the surface of the electrostatic chuck 20. In the exemplary embodiment the inner electrode 22a is a disk and the outer electrode 22b is a ring positioned around the periphery of the inner electrode 22a. The electrodes have substantially planar upper surfaces. Preferably, the inner and outer electrodes are substantially of equal area in order to apply uniform charge across the electrostatic chuck. The inner and outer electrodes 22a and 22b are covered with a thin dielectric coating (not shown) across the entire surface of each electrode for electrical isolation. Preferably a high quality dielectric coating such as aluminum oxide is used. Wafer 24 is placed atop the upper surfaces of electrodes 22a and 22b to support the wafer 24 during processing.

Figure 3A:
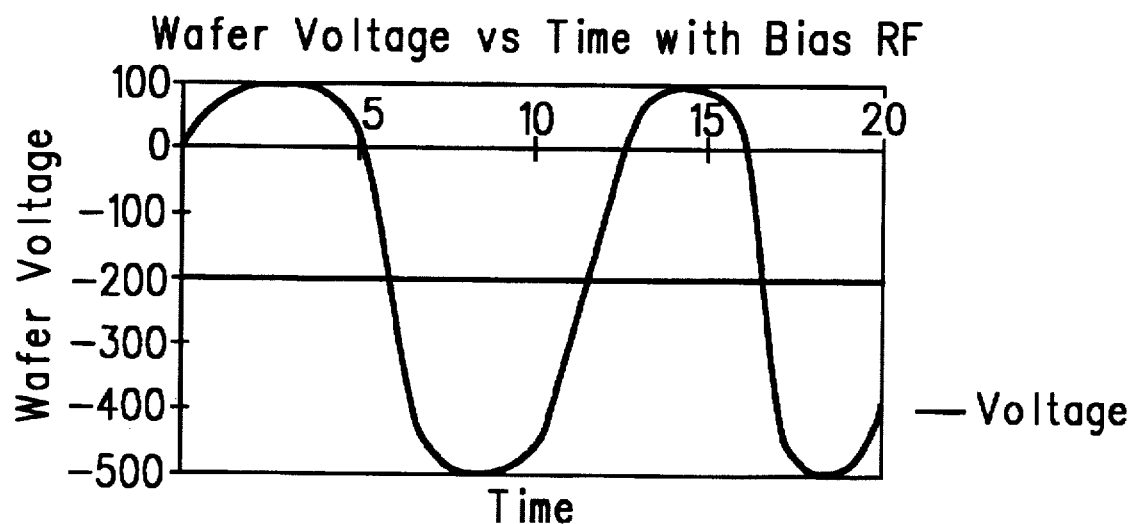
FIG. 3A illustrates a graph of the voltage on a wafer as a function of time when rf bias is applied to the wafer.
Figure 3B:
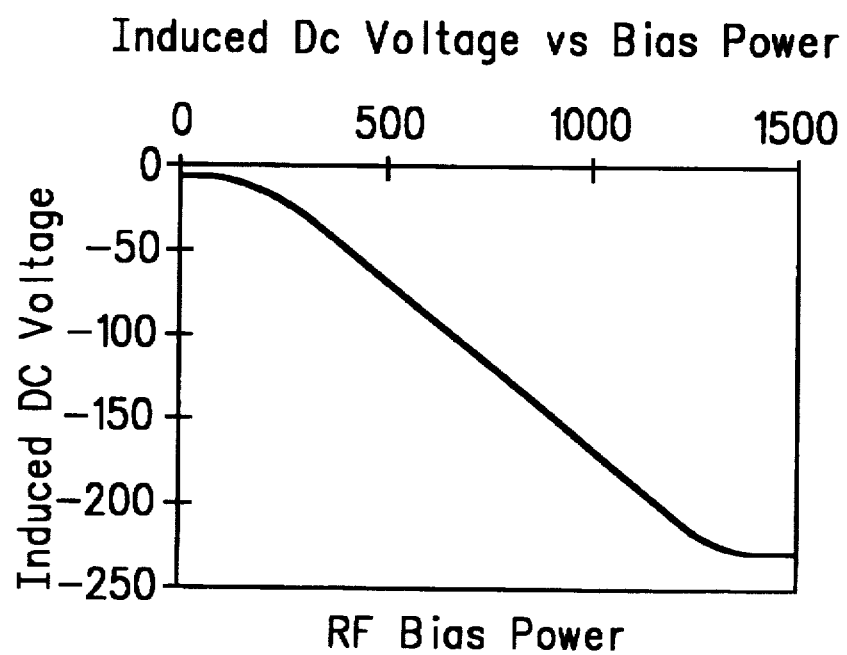
FIG. 3B depicts a graph of the dc voltage induced on the wafer (Vdc) as a function of the rf bias power applied to the substrate.

To electrostatically attract, or clamp, the wafer 24 to the electrostatic chuck, the dc voltage system 29 applies dc voltage to the electrodes. Referring again to FIG. 2, the dc voltage system generally includes a first electrical connector 40a which couples the inner electrode 22a to a dc voltage supply 30, and a second electrical connector 40b which couples the outer electrode 22b to the dc voltage supply 30. The dc voltage supply 30 applies a dc bias to the electrodes whereby the polarity of the inner electrode 22a is the opposite of the polarity of the outer electrode 22b. The applied bias causes a voltage to develop across the thin dielectric coating on the electrodes 22a and 22b, and image charges are induced on the back side of the wafer 24. This difference in charge attracts the wafer to the surface of the electrodes, i.e. the wafer 24 is "clamped" to the electrostatic chuck 20. The attraction is referred to as the "electrostatic force" ( or sometimes called the "clamping force") and is proportional to the square of the voltage and inversely proportional to the separation between the electrodes 22a and 22b and the wafer 24. When the wafer is initially clamped to the electrostatic chuck by applying the dc voltage to the electrodes, the voltage at the surface of the wafer is zero. However, when rf power is applied across a capacitor, such as the dielectric, the surface of wafer acquires a negative voltage due to its exposure to the plasma. Moreover, this voltage on the wafer is time dependent and thus varies with time. Such a condition is referred to as the rf peak-to-peak voltage, and is illustrated in FIG. 3A. The positive peak of the rf voltage waveform is clipped because of the difference in carrier mobility between electrons and ions in the plasma. From this condition, an "induced dc voltage" (Vdc) on the wafer is defined. The Vdc is the time average of the voltage seen on the wafer surface exposed to the plasma. The inventors have found that the Vdc is a function of the plasma conditions. The inventors have discovered that over a narrow range of rf bias the Vdc is proportional to the rf bias power applied to the electrostatic chuck 20. However, over a large range of operation the relationship between the applied rf bias and the Vdc is non-linear. Of particular advantage, the present invention provides a method for securely holding a wafer over a wide range of applied rf bias. For instance, the Vdc is proportional to the rf power applied to the electrostatic chuck 20, as shown in FIG. 3B.

In the present embodiment, the electrostatic chuck 20 is particularly adapted for use with PECVD processing and the application of sputter etching to enhance the deposition of void-free good quality layers of material on the surface of wafer 24. Turning again to FIG. 2, to induce sputter etching, the rf voltage system 31 applies rf bias to the electrostatic chuck 20. In particular, an rf generator 32 applies rf voltage to the inner and outer electrodes 22a and 22b through match network 34, electrical connector 35 and rf transmitting capacitors 41a and 41b. In the exemplary embodiment, dc source 30 and rf source 32 are combined and coupled directly into the electrodes 22a and 22b with the dc source 30 being tied to the same connection through RC filters (not shown). The rf bias applied to the electrostatic chuck 20 may be varied by the use of variable capacitors (not shown) and generally will be varied as the impedance in the process chamber 16 changes during processing due to factors such as the flow rates of the process gases, and deposition of the film.

The introduction of rf bias to the electrostatic chuck 20 modifies the electrostatic force between the wafer 24 and the electrostatic chuck 20 by changing the voltage induced at the wafer surface Vdc. The inventive method and apparatus described herein provides an offset voltage control system 37 suitable for restoring the appropriate electrostatic force, i.e. the force necessary to ensure secure clamping of the wafer 24 to the electrostatic chuck 20 during processing. The inventors have discovered that by measuring the peak to peak rf voltage applied to the chuck, the voltage induced at the wafer surface Vdc can be determined. Specifically, the induced voltage Vdc experienced at the surface of the wafer 24 varies with the peak to peak rf voltage measured at the matching interface 34. This induced voltage Vdc results in an unequal force between each electrode and the wafer. Thus, the electrostatic force is no longer uniform across the wafer.

Of particular advantage, the offset voltage control system 37 produces an offset voltage to restore the electrostatic force for secure clamping of the wafer 24. Of further advantage, it has been found that utilizing the offset voltage allows for the application of a lowe voltage across the dielectric coating between the electrodes when commmpared to the voltage required to clamp the wafer if no offset is used. To produce the offset voltage a variety of control means may be employed, and in the preferred embodiment the offset voltage control system 37 generally includes a detector 38 coupled to the rf connector 35 for detecting the rf bias applied to the electrodes 22a and 22b. The detector 38 then produces a voltage responsive to the detected rf bias. The voltage is sent to a signal generator 36 which converts the voltage to an output signal that drives an offset voltage generator 39. The offset voltage generator 39 produces a corresponding offset voltage in response to the output signal from signal generator 36. The offset voltage is coupled to the center-tap 33 of the voltage supply 30, whereby the offset voltage is applied to the inner and outer electrodes 22a and 22b. The offset voltage is applied in equal magnitude to the inner and outer electrodes. It has been found that the offset voltage varies dependent upon the chemistry and processes employed in the CVD reactor. According to the present invention, the rf bias power may operate over a range of 0 to 4000 watts, and the offset voltage will vary in the range of 0 to 800 volts. For an rf bias power operating range of about 0 to 2500 Watts, the offset voltage is in a range of about 0 to 500 volts. In an exemplary embodiment, using a typical CVD process to deposit a dielectric film, the offset voltage will vary in a range of about 200 to 350 volts.

Figure 4:
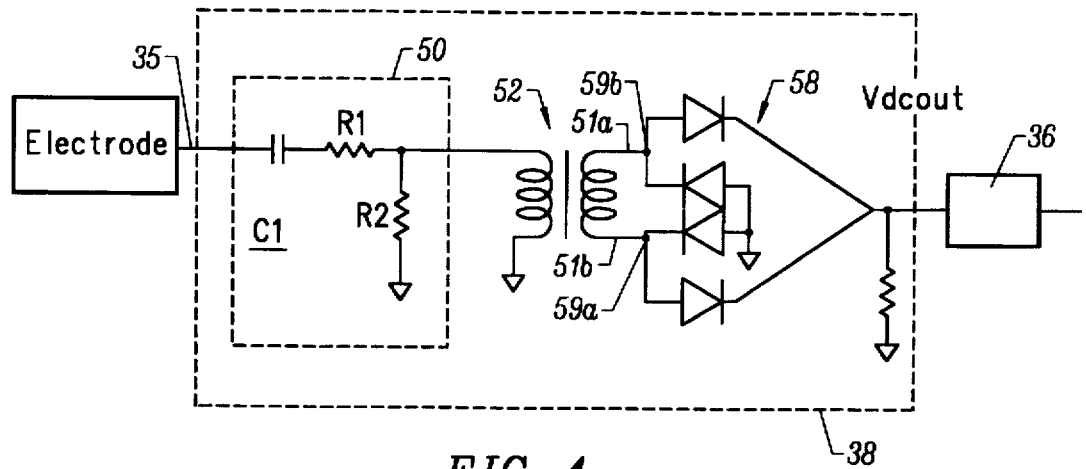
FIG. 4 is a schematic diagram of a control circuit suitable for generating an offset voltage in accordance with one embodiment of the present invention.

The preferred embodiment of the detector 38 is shown in greater detail with reference to FIG. 4. The detector 38 generally includes a circuit for producing an offset voltage representative of the induced voltage Vdc from measurement of the applied rf voltage. Specifically, the detector circuit 38 includes a resistor voltage divider circuit 50 having capacitor C1 which blocks DC, and resistors R1 and R2 coupled to the inner and outer electrodes 22a and 22b through electrical connector 35. This embodiment has a wide frequency response so that the first three harmonics of the voltage waveform fundamental frequency are not attenuated. This is important because at high chuck RF power levels the waveform shown in FIG. 3A exhibits more pronounced clipping of the positive half cycle. The result is higher harmonic content in the waveform. A transformer 52, with output terminals 51a and 51b, is coupled to the voltage divider circuit 50, and the output terminals 51a and 51b are each coupled to a diode bridge 58 vias input terminals 59a and 59b. The output of the diode bridge 58 is coupled to a controller 36.

To produce an offset voltage in accordance with the present invention, the voltage divider 50 reduces the amplitude of the rf voltage measured at electrical connector 35. The transformer 52 provides rf to dc isolation and provides balanced signals. The diode bridge 58 rectifies the signals output from the transformer and provides a dc voltage as its output. This dc voltage is responsive to the applied rf voltage which is related to the induced dc voltage on the wafer surface. This control circuit provides a feedback control loop that is responsive to changes in the process.

Alternatively, the offset voltage may be determined by an offset voltage control system 37 that measures the rf bias power, as opposed to the rf voltage, and produces a voltage responsive to such power.

In another embodiment, a predetermined offset voltage value may be applied to the electrodes 22a and 22b, instead of using a control circuit. Additionally, a set of predetermined offset voltages may be applied to the electrodes 22a and 22b. In this embodiment the offset voltage control system 37 includes a computer having means for storing and selecting at least one predetermined offset voltage value. For example, the predetermined set of offset voltages may be determined by experiments at certain process conditions and then stored in the memory of a computer.

As stated above, it has been found that the relationship of the induced dc voltage on the wafer surface and the offset voltage are linear only over a narrow operating range. Over a large operating range this relationship is non-linear. When operating over the large range, it is preferred to determine the offset voltage by using a look-up table. Using a look up table, offset voltage values can be determined experimentally for any set of process conditions by examining process uniformity as the voltage is varied. The values that produce optimum process results are stored in the look-up table in computer memory. Then when a process is run, the controller 36 references the look-up table to determine the offset voltage value for the current process conditions.

Figure 5:
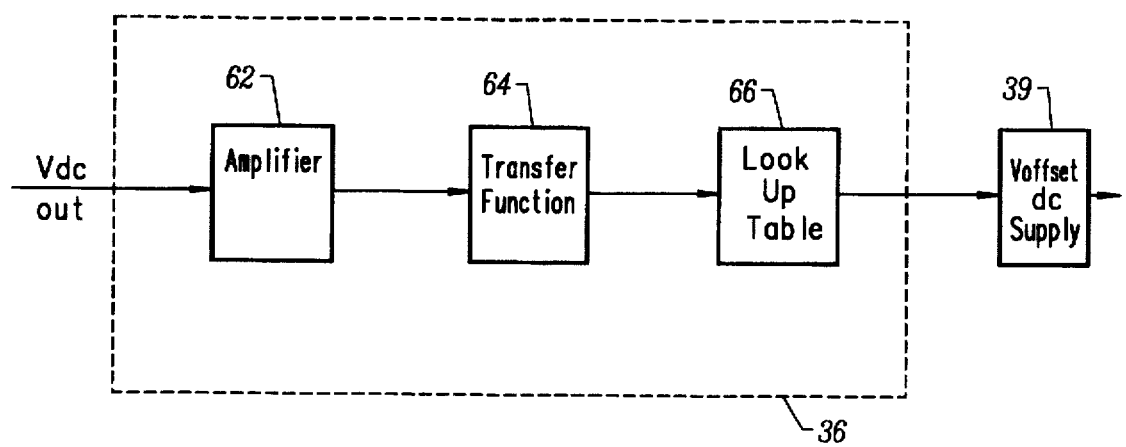
FIG. 5 is a block diagram of a controller in accordance with one embodiment of the present invention.

The preferred embodiment of the controller 36 is shown in greater detail in FIG. 5. The controller 36 generally includes an amplifier 62, a transfer function 64 and a look up table 66. To produce the offset voltage, the voltage signal representative of the Vdc is output from the detection circuit 38. The signal is amplified by some constant, and a transfer function for non-linearity is applied. The resultant value is then stored in a look-up table in computer memory 66. A plurality of values may be stored in the look-up table. For instance, values for a variety of process conditions may be determined experimentally by evaluating process uniformity as the offset voltage is varied. The offset voltage that produces the best results for a given set of process parameters is stored in the look-up table. Then, when a process is run, the controller will access the look-up table to determine the appropriate value. This value is then sent the dc offset supply 39 and the dc offset voltage supply 39 generates a corresponding offset voltage which is applied to the electrodes.

While the invention has been described with reference to a bi-polar electrostatic chuck, it is to be understood by those of ordinary skill in the art that the same method and apparatus may be applied to mono-polar and multi-polar electrostatic chucks as well.

Figure 6:
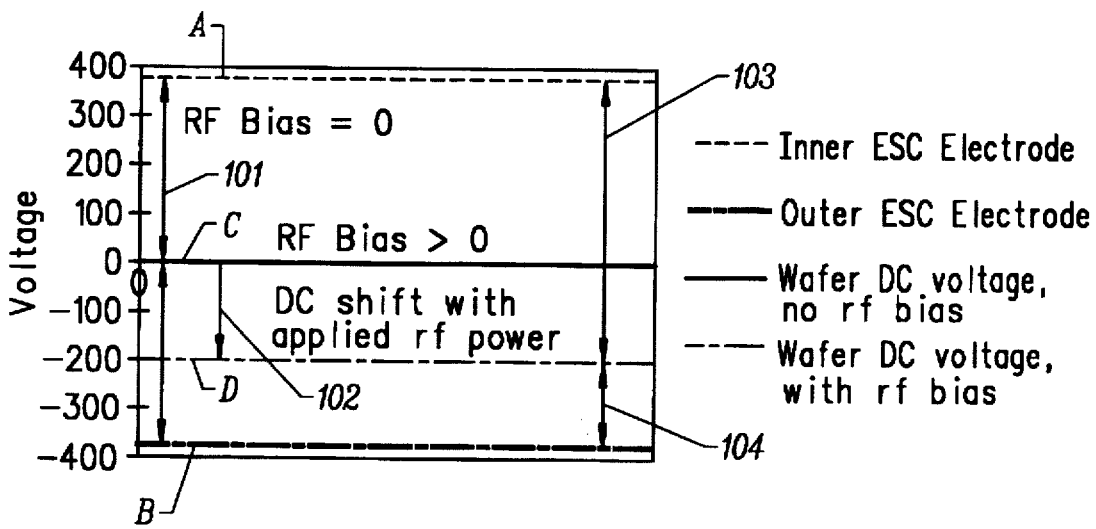
FIG. 6 is a graphical representation of the voltage differential between the inner and outer electrodes of an electrostatic chuck, and the wafer supported on the chuck.

The operation and method of the invention is now described in further detail. Turning to FIG. 6 in the exemplary embodiment, the inner electrode 22a is held at a positive voltage shown as line A, while the outer electrode 22b is held at a negative voltage shown as line B. This condition clamps the wafer with an initial electrostatic force, and the wafer experiences zero voltage on its surface as illustrated by line C. Arrows 101 and 102 represent the voltage between the wafer and the inner 22a and outer 22b electrodes, respectively. As is clearly shown, each electrode clamps the wafer with a voltage of equal magnitude and opposite polarity.

Figure 7:
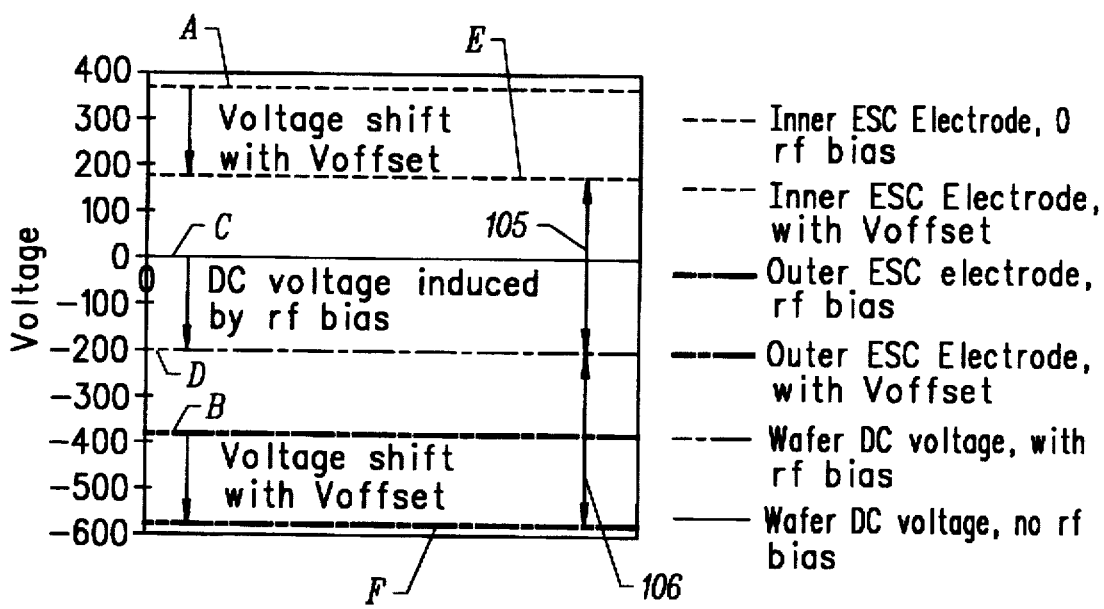
FIG. 7 is a graph showing the voltage differential between the inner and outer electrodes of an electrostatic chuck, and the wafer supported on the chuck, after an offset voltage is applied to the chuck in accordance with the present invention.

RF bias is now applied to the electrodes. As described above, this induces a dc voltage Vdc on the surface of the wafer 24, represented by line D on FIG. 7. A change has now occurred with reference to the voltage between the wafer and the inner and outer electrodes. As shown by arrow 103, the voltage between the inner electrode 22a and the wafer has increased, while the voltage between the outer electrode 22a and the wafer has decreased. Since the electrostatic force is proportional to the voltage, the electrostatic force between the wafer and the inner electrode is now greater than the condition where no rf bias is applied, while the force between the wafer and the outer electrode is now less. Thus, there is an electrostatic force imbalance between the two electrodes, and the initial electrostatic force is changed. This imbalance can cause the wafer to "declamp" resulting in temperature conduction variations across the surface of the chuck, and non-uniform processing of the wafer. Moreover, the wafer can be pushed off the electrostatic chuck causing breakage of the wafer and even arcing within the system which can cause catastrophic failure of the electrostatic chuck and other reactor components.

Of particular advantage, the present invention provides a method and apparatus for restoring the initial electrostatic force by applying the offset voltage, thereby ensuring secure clamping of the wafer. FIG. 6 depicts the application of the offset voltage in accordance with one embodiment of the present invention. As shown, line D represents the induced voltage on the surface of the wafer Vdc. With the application of the offset voltage, the voltage on the inner and outer electrodes are shifted by the magnitude of the offset voltage. Specifically, the voltage of the inner electrode is shifted from line A to line E. In this example, an offset voltage of approximately −200V is applied to the inner electrode, and thus the inner electrode is now at approximately 200V. Conversely, the voltage of the outer electrode is shifted from line B to line F. In this example, an offset voltage of approximately −200V is applied to the outer electrode, and thus the outer electrode is now at approximately −600V. As shown by arrows 105 and 106, the voltages between the inner and outer electrodes and the wafer, respectively, are again of equal magnitude. Thus, the imbalance has been removed, and the initial electrostatic force has been restored.

In accordance with the present invention, the offset voltage applied to the inner and outer electrodes is responsive to the changing induced voltage on the wafer, and thus maintains secure clamping of the wafer throughout processing.

The foregoing description of specific embodiments of the invention have been presented for the purpose of illustration and description. They are not intended to be exhaustive or to limit the invention to the precise forms disclosed, and obviously many modifications, embodiments, and variations are possible in lights of the above teaching. It is intended that the scope of the invention be defined by the Claims appended hereto and their equivalents.

We claim:

1. A method of holding a substrate to an electrostatic chuck throughout processing, said method comprising the steps of:

forming an initial electrostatic clamping force between said electrostatic shuck and said substrate;

modifying said initial electrostatic clamping force when an rf voltage is applied to said electrostatic chuck during processing; and restoring said initial electrostatic clamping force with an offset voltage applied to said electrostatic chuck, wherein the step of restoring said initial electrostatic clamping force with an offset voltage further comprises the steps of:

detecting said rf voltage;

producing an output voltage responsive to said rf voltage by
  reducing the amplitude of said rf voltage,
  transforming said rf voltage to provide rf and dc isolated signals, and
  rectifying said rf signal to provide said output voltage,
  converting the output voltage to an output signal; and generating said offset voltage responsive to the output signal.

2. The method of claim 1 wherein said offset voltage is proportional to said rf voltage.

3. The method of claim 1 wherein said offset voltage varies non-linearly with respect to said rf voltage.

4. The method of claim 1 further comprising:

producing said rf voltage by applying an rf bias power in the range of approximately 0 to 4000 Watts to said electrostatic chuck.

5. The method of claim 1 wherein said offset voltage is in the range of approximately 0 to 500 volts.

6. The method of claim 1 wherein said offset voltage is in the range of approximately 200 to 350 volts.

7. The method of claim 1 wherein said offset voltage is in the range of approximately 200 to 220 volts.

8. An electrostatic chuck having at least one electrode and a dielectric on the surface of said at least one electrode for supporting a substrate, comprising:

a dc voltage source coupled to said at least one electrode for electrostatically clamping the substrate to the surface of said electrostatic chuck with an initial electrostatic force;

an rf source coupled to said at least one electrode for applying rf voltage to said electrostatic chuck, and thereby causing a change in said initial electrostatic force; and a control system coupled to said dc voltage source for controlling the voltage of said voltage source to restore said initial electrostatic force, wherein said control system further comprises:

a detector coupled to said rf voltage for producing an output voltage in response to said rf voltage, wherein said detector includes a circuit having a voltage divider coupled to said rf voltage source to reduce the amplitude of said rf voltage, a transformer having first and second output terminals, coupled to the output of said voltage divider to provide rf to dc isolation, and a diode bridge having first and second input terminals, coupled to said first and second output terminals of said transformer, to provide a dc voltage output that is proportional to said rf voltage;

a controller for receiving the output voltage and producing and producing a control signal responsive to the output voltage; and an offset voltage generator for receiving the control signal and producing an offset voltage responsive to the control signal.

9. The electrostatic chuck of claim 8 wherein said control system includes a control circuit for providing an output signal, said output signal being proportional to said rf voltage.

10. An electrostatic chuck having an inner electrode and an outer electrode and a dielectric on the surface of said inner and outer electrodes for supporting a substrate, comprising:

a voltage source coupled to said inner and outer electrode for electrostatically clamping the substrate to the surface of said electrostatic chuck with an initial electrostatic force;

an rf source having an rf bias power coupled to said inner and outer electrode for applying rf bias power in the range of approximately 0 to 4000 Watts, to said electrostatic chuck, and thereby causing a change in said initial electrostatic force; and a control system coupled to each of said rf and voltage sources to restore said initial electrostatic force in response to the change in said initial electrostatic force, said control system having:

a detector coupled to said rf voltage for producing an output voltage in response to said rf voltage, wherein said detector includes a circuit having a voltage divider coupled to said rf voltage source to reduce the amplitude of said rf voltage, a transformer having first and second output terminals, coupled to the output of said voltage divider to provide rf to dc isolation, and a diode bridge having first and second input terminals, coupled to said first and second output terminals of said transformer, to provide a dc voltage output responsive to said rf voltage;

a controller for receiving the output voltage and producing a control signal responsive to the output voltage; and an offset voltage generator for receiving the control signal and producing said offset voltage responsive to the control signal.

11. A circuit for measuring the induced voltage on a wafer placed in a plasma environment when rf voltage is applied to said wafer, comprising:

a voltage divider coupled to said rf voltage source to reduce the amplitude of said rf voltage;

a transformer, having a first and second output terminals, coupled to the output of said voltage divider to provide rf to dc isolation; and a diode bridge, having first and second input terminals, coupled to said first and second output terminals of said transformer to provide a dc voltage output that is representative of the induced voltage on the wafer.

* * * * *